(12) United States Patent
Hori et al.

(10) Patent No.: US 9,159,901 B2
(45) Date of Patent: Oct. 13, 2015

(54) COMPOSITE SUBSTRATE AND ELASTIC WAVE DEVICE

(71) Applicant: NGK INSULATORS, LTD., Aichi (JP)

(72) Inventors: Yuji Hori, Owariasahi (JP); Tomoyoshi Tai, Inazawa (JP)

(73) Assignee: NGK INSULATORS, LTD., Aichi (JP)

( * ) Notice: Subject to any disclaimer, the term of this patent is extended or adjusted under 35 U.S.C. 154(b) by 0 days.

(21) Appl. No.: 14/521,854

(22) Filed: Oct. 23, 2014

(65) Prior Publication Data

US 2015/0042207 A1 Feb. 12, 2015

Related U.S. Application Data

(63) Continuation of application No. PCT/JP2014/055421, filed on Mar. 4, 2014.

(30) Foreign Application Priority Data

Mar. 27, 2013 (JP) .................. 2013-066319

(51) Int. Cl.
*H03H 9/25* (2006.01)
*H01L 41/08* (2006.01)
*H03H 9/02* (2006.01)

(52) U.S. Cl.
CPC ....... *H01L 41/0805* (2013.01); *H03H 9/02834* (2013.01); *H03H 9/02574* (2013.01)

(58) Field of Classification Search
CPC .......... H03H 9/02818; H03H 9/02834; H03H 9/02574; H03H 9/02614; H03H 9/02102; H03H 9/02047; H03H 9/02055; H03H 9/02031

USPC .......................................................... 310/313
See application file for complete search history.

(56) References Cited

U.S. PATENT DOCUMENTS

| | | | |
|---|---|---|---|
| 3,943,389 A * | 3/1976 | Hickernell et al. ....... | 310/313 A |
| 5,294,477 A | 3/1994 | Kanba et al. | |
| 5,446,330 A * | 8/1995 | Eda et al. ................. | 310/313 R |
| 5,998,907 A * | 12/1999 | Taguchi et al. ........... | 310/313 R |
| 6,124,635 A | 9/2000 | Kuwabara | |

(Continued)

FOREIGN PATENT DOCUMENTS

| | | |
|---|---|---|
| JP | 04-206955 A | 7/1992 |
| JP | 04-239187 A | 8/1992 |

(Continued)

OTHER PUBLICATIONS

European Search Report for European Patent App. No. 14774484.1 (Apr. 24, 2015).

(Continued)

*Primary Examiner* — J. San Martin
(74) *Attorney, Agent, or Firm* — Cermak Nakajima & McGowan LLP; Tomoko Nakajima

(57) ABSTRACT

A composite substrate 10 is a substrate formed by bonding a piezoelectric substrate 12 and a support substrate 14 having a coefficient of thermal expansion lower than that of the piezoelectric substrate 12. The support substrate 14 has a first surface 14a bonded to the piezoelectric substrate 12 and a second surface 14b opposite to the first surface 14a. The coefficient of thermal expansion of the support substrate 14 is decreased along a thickness direction from the second surface 14b to an intermediate position 14c located between the first surface 14a and the second surface 14b.

7 Claims, 6 Drawing Sheets

(56) References Cited

U.S. PATENT DOCUMENTS

| | | | |
|---|---|---|---|
| 6,426,583 B1 | 7/2002 | Onishi et al. | |
| 7,408,286 B1 | 8/2008 | Bhattacharjee et al. | |
| 2004/0036381 A1* | 2/2004 | Abbott et al. | 310/313 R |
| 2004/0135650 A1* | 7/2004 | Miura et al. | 333/133 |
| 2008/0024037 A1* | 1/2008 | Tamura et al. | 310/313 A |
| 2010/0244631 A1* | 9/2010 | Kobayashi et al. | 310/346 |
| 2013/0328451 A1 | 12/2013 | Takashi et al. | |
| 2015/0028720 A1* | 1/2015 | Kando | 310/313 A |
| 2015/0091416 A1* | 4/2015 | Hori et al. | 310/348 |

FOREIGN PATENT DOCUMENTS

| | | |
|---|---|---|
| JP | 04-340258 A | 11/1992 |
| JP | 5-20418 U | 3/1993 |
| JP | 06-343274 A | 12/1994 |
| JP | 10-270613 A | 10/1998 |
| JP | 2002-292611 A | 10/2002 |
| JP | 2007-157971 A | 6/2007 |
| JP | 2008-301066 A | 12/2008 |
| JP | 2008-306134 A | 12/2008 |
| JP | 2011-067915 A | 4/2011 |
| JP | 2012-109399 A | 6/2012 |
| WO | WO2012/144185 A1 | 10/2012 |

OTHER PUBLICATIONS

International Search Report and Written Opinion for PCT Patent App. No. PCT/JP2014/055421 (Jun. 3, 2014) with English translation of the Search Report.

* cited by examiner

COMPOSITE SUBSTRATE AND ELASTIC WAVE DEVICE

BACKGROUND OF THE INVENTION

1. Field of the Invention

The present invention relates to a composite substrate and an elastic wave device.

2. Description of the Related Art

In recent years, in order to improve frequency-temperature characteristics of an elastic wave device, a composite substrate formed by bonding a piezoelectric substrate onto a support substrate having a low coefficient of thermal expansion has been used. A general process for forming elastic wave devices using the composite substrate as described above is performed as follows. First, elastic wave-device electrodes are formed on a surface of the piezoelectric substrate of the composite substrate. The surface of the piezoelectric substrate is partitioned so that many elastic wave devices are to be formed, and the elastic wave-device electrodes are formed using a photolithographic technique on positions of the respective elastic wave devices. Next, the composite substrate is diced along the partitions, so that many elastic wave devices are obtained.

However, when heat is applied to the composite substrate in the process for forming elastic wave devices, a stress is generated by the difference in thermal expansion between the piezoelectric substrate and the support substrate. Hence, the composite substrate is considerably deformed, and the accuracy of the electrode width is degraded, so that the frequency characteristics may be degraded in some cases. In addition, depending on the cases, because of the stress generated at the interface between the piezoelectric substrate and the support substrate, the piezoelectric substrate may be peeled away from the support substrate or may be fractured in some cases. As a method to overcome the problems as described above, a composite substrate having a three-layer structure has been proposed in which a compensating layer having a coefficient of thermal expansion equivalent to that of a piezoelectric substrate is provided on a surface of a support substrate opposite to that in contact with the piezoelectric substrate (Patent Literature 1).

CITATION LIST

Patent Literature

Patent Literature 1: U.S. Pat. No. 7,408,286

SUMMARY OF INVENTION

Technical Problem

However, when the composite substrate disclosed in Patent Literature 1 is formed, a very complicated process is required, and it is difficult to realize this composite substrate.

The present invention was made to overcome the problems as described above, and a primary object of the present invention is to provide a composite substrate having a relatively simple structure and preferable characteristics and an elastic wave device using the composite substrate described above.

Solution to Problem

In order to achieve the above primary object, the present invention has the following configuration.

A composite substrate of the present invention is formed by bonding a piezoelectric substrate and a support substrate having a coefficient of thermal expansion lower than that of the piezoelectric substrate, wherein the support substrate has a first surface bonded to the piezoelectric substrate and a second surface opposite to the first surface, and one specific characteristic value selected from the coefficient of thermal expansion and the Young's modulus is decreased along a thickness direction from the second surface to an intermediate position between the first surface and the second surface.

In addition, the "intermediate position" may be any position as long as being located between the first surface and the second surface, and for example, the intermediate position may be located at the center between the first surface and the second surface, at a position closer to the first surface than the center, or at a position closer to the second surface than the center.

An elastic wave device of the present invention includes: the composite substrate described above, and
an elastic wave-device electrode formed on a surface of the piezoelectric substrate of the composite substrate.

Advantageous Effects of Invention

Since being capable of using a support substrate formed from a so-called functionally gradient material, the composite substrate of the present invention has a relatively simple structure. In addition, for example, when the specific characteristic value is the coefficient of thermal expansion, the coefficient of thermal expansion is decreased along a thickness direction of the support substrate from the second surface to the intermediate position. Hence, in an elastic wave device formed using the composite substrate of the present invention, the temperature coefficient of frequency can be made equivalent or superior to that of an elastic wave device formed using a related support substrate. In addition, the warpage of the substrate generated when the composite substrate is heated can also be reduced to be small. On the other hand, when the specific characteristic value is the Young's modulus, the Young's modulus is decreased along a thickness direction of the support substrate from the second surface to the intermediate position. Hence, a thermal stress at the bonding surface between the piezoelectric substrate and the support substrate is significantly reduced, and peeling between the two substrates can be significantly prevented.

The elastic wave device of the present invention uses the composite substrate of the present invention described above. Hence, when the specific characteristic value is the coefficient of thermal expansion, in an elastic wave device formed by using this composite substrate, the temperature coefficient of frequency can be made equivalent or superior to that of an elastic wave device formed using a relate support substrate. On the other hand, when the specific characteristic value is the Young's modulus, in an elastic wave device formed by using this composite substrate, a stress at the bonding surface between the piezoelectric substrate and the support substrate is significantly reduced, and peeling between the two substrates can be significantly prevented.

DESCRIPTION OF EMBODIMENT

Figure 1:
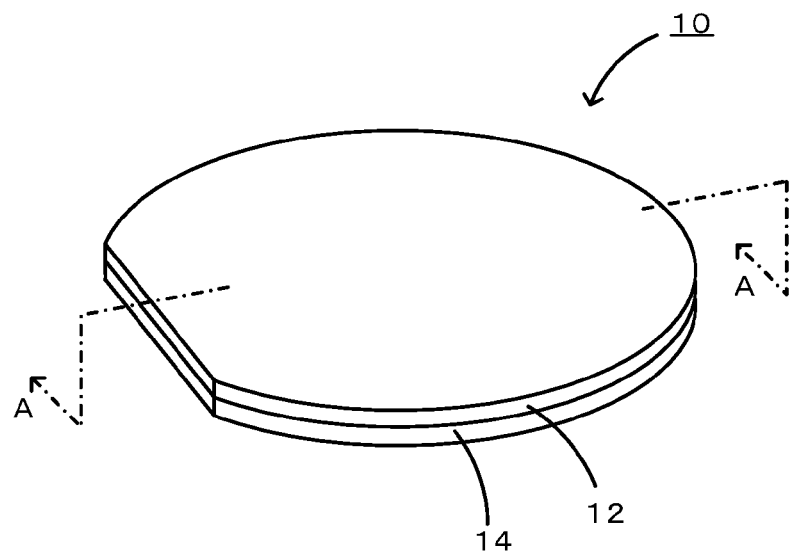
FIG. 1 is a perspective view of a composite substrate 10.
Figure 2:
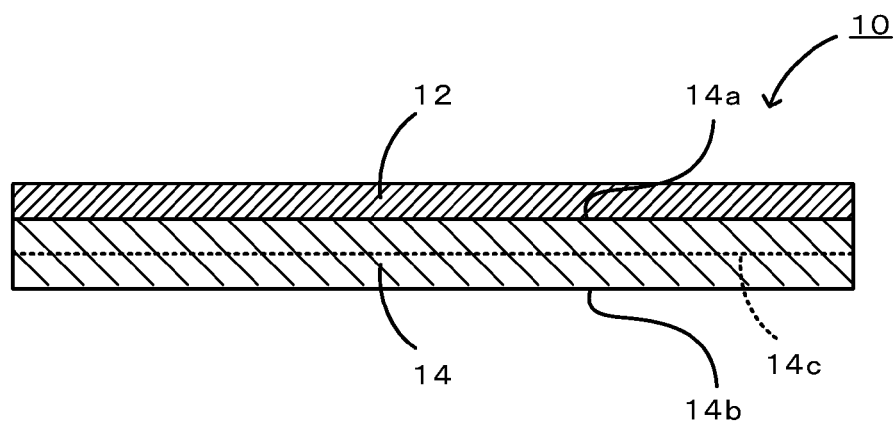
FIG. 2 is a cross-sectional view taken along the line A-A in FIG. 1.

Next, an embodiment of the present invention will be described with reference to the drawings. FIG. 1 is a perspective view of a composite substrate 10 of this embodiment, and FIG. 2 is a cross-sectional view taken along the line A-A in FIG. 1. This composite substrate 10 includes a piezoelectric substrate 12 and a support substrate 14.

The piezoelectric substrate 12 is a substrate capable of propagating an elastic wave. As a material for this piezoelectric substrate 12, for example, there may be mentioned lithium tantalate (LT), lithium niobate (LN), a lithium niobate-lithium tantalate solid solution single crystal, quartz, lithium borate, zinc oxide, aluminum nitride, langasite (LGS), or langatate (LGT). Among those mentioned above, LT or LN is preferable. The reason for this is that since having a high propagation rate of a surface acoustic wave and a high electromechanical coupling coefficient, LT and LN are each suitably used for a high-frequency or a wideband-frequency elastic wave device. The size of the piezoelectric substrate 12 is, for example, 50 to 150 mm in diameter and 0.2 to 50 μm in thickness. The coefficients of thermal expansion of representative materials used for the piezoelectric substrate 12 are shown in Table 1.

TABLE 1

| | Material | Coefficient of thermal expansion (ppm/° C.) |
|---|---|---|
| Piezoelectric substrate | Lithium tantalate | 16.1 |
| | Lithium niobate | 15.4 |
| | Quartz | 13.7 |
| | Lithium borate | 13 |

Figure 3:
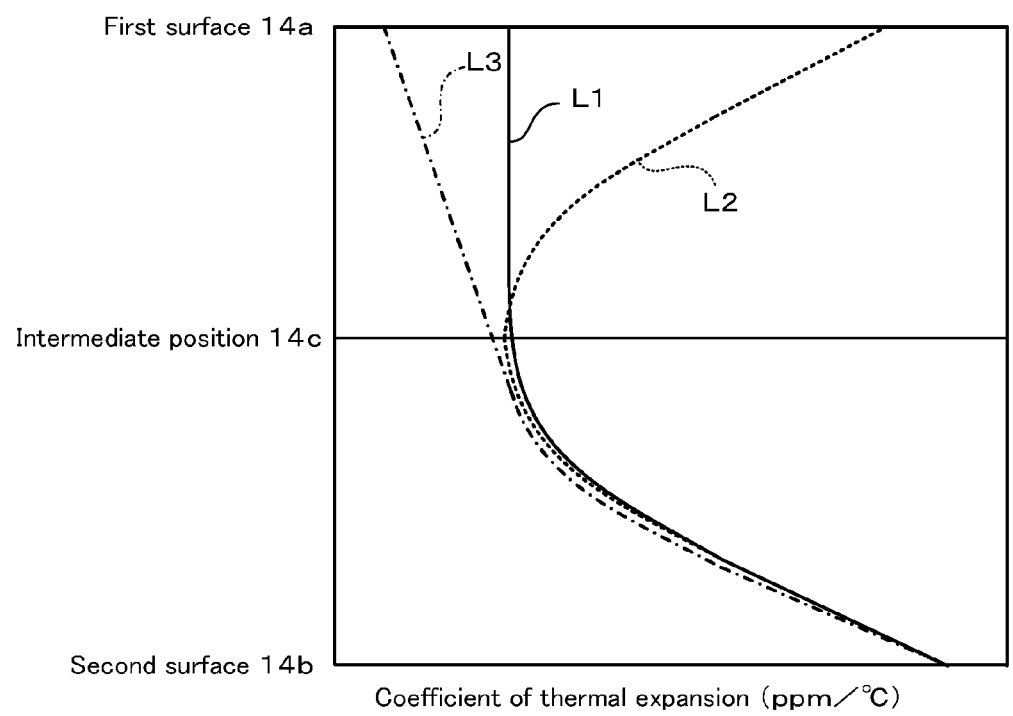
FIG. 3 is a graph showing the change in coefficient of thermal expansion along a thickness direction of a support substrate 14.

Although the coefficient of thermal expansion of the support substrate 14 is changed along a thickness direction thereof, the coefficient of thermal expansion of the support substrate 14 is lower than that of the piezoelectric substrate 12, and the support substrate 14 is bonded directly to the rear surface of the piezoelectric substrate 12 or is bonded thereto with an organic adhesive layer interposed therebetween. Since the coefficient of thermal expansion of the support substrate 14 is set to be lower than that of the piezoelectric substrate 12, the change in size of the piezoelectric substrate 12 with the change in temperature is suppressed, and when the composite substrate 10 is used for an elastic wave device, the change in frequency characteristics with temperature can be suppressed. This support substrate 14 has a first surface 14a bonded to the piezoelectric substrate 12 and a second surface 14b opposite to the first surface 14a. The support substrate 14 is formed of a functionally gradient material in which the coefficient of thermal expansion is changed along its thickness direction. FIG. 3 shows the relationship between the coefficient of thermal expansion of the support substrate 14 and the thickness direction thereof. In all three patterns L1 to L3, the coefficient of thermal expansion of the support substrate 14 is decreased along the thickness direction from the second surface 14b to an intermediate position 14c located between the first surface 14a and the second surface 14b. In addition, the coefficient of thermal expansion of the pattern L1 is approximately constant from the intermediate position 14c to the first surface 14a; the coefficient of thermal expansion of the pattern L2 is increased along the thickness direction from the intermediate position 14c to the first surface 14a; and the coefficient of thermal expansion of the pattern L3 is decreased along the thickness direction from the intermediate position 14c to the first surface 14a. In addition, in all the three patterns L1 to L3, the coefficient of thermal expansion at the second surface 14b is higher than that at the intermediate position 14c. In order to reduce the warpage of the composite substrate 10, the coefficient of thermal expansion at the second surface 14b is preferably substantially approximately equivalent to that of the piezoelectric substrate 12. In the pattern L2, the coefficient of thermal expansion at the first surface 14a is also preferably substantially the same as that of the piezoelectric substrate 12. In addition, besides the case in which the two coefficients are equal to each other, the "substantially the same" also includes the case in which the difference therebetween is within ±10%. For example, when the piezoelectric substrate 12 is formed of LT (having a coefficient of thermal expansion of 16.1 ppm/° C.), the coefficient of thermal expansion at the second surface 14b is set to 15 to 17 ppm/° C. The size of the support substrate 14 is, for example, 50 to 150 mm in diameter and 100 to 500 μm in thickness.

The intermediate position 14c of the support substrate 14 is not particularly limited as long as being located between the first surface 14a and the second surface 14b and, for example, may be located at the center between the first surface 14a and the second surface 14b, at a position closer to the first surface 14a than the center, or at a position closer to the second surface 14b than the center.

Next, a method for manufacturing the composite substrate 10 as described above will be described. First, the support substrate 14 is formed. The support substrate 14 may be formed in such a way that after at least three molded bodies (such as green sheets), material components of which are each adjusted so as to obtain desired characteristics, are laminated to each other to form a laminate, the laminate thus formed is fired. In addition, as the material components, for example, various types of ceramic raw material powders may be mentioned. The representative examples thereof are shown in Table 2. The powders of the various piezoelectric materials shown in Table 1 each may also be used as a part of the support substrate and each may also be formed into a composite material in combination with at least one of the ceramics shown in Table 2. Subsequently, the support substrate 14 and the piezoelectric substrate 12 are bonded to each other. In particular, the first surface 14a of the support substrate 14 and the rear surface of the piezoelectric substrate 12 are bonded to each other. As a bonding method, either direct bonding or bonding with an organic adhesive layer interposed between the substrates may be used. In the case of the direct bonding, first, bonding surfaces of the two substrates 12 and 14 are cleaned to remove dust and the like adhering to the bonding surfaces thereof. Next, by irradiation of the bonding surfaces of the two substrates 12 and 14 with ion beams of an inert gas, such as argon, in vacuum, remaining impurities (oxide films and/or absorbed substances) are removed, and at the same time, the bonding surfaces are activated. Subsequently, in vacuum, the two substrates 12 and 14 are bonded to each other at ordinary temperature. In the case of the bonding with an organic adhesive layer interposed between the substrates, first, an organic adhesive is uniformly applied to at least one of the first surface 14a of the support substrate 14 and the rear surface of the piezoelectric substrate 12, and the organic adhesive is then solidified while the two substrates are overlapped with each other, so that the bonding is performed. As described above, the composite substrate 10 can be obtained.

TABLE 2

|  | Material | Formula, etc. | Coefficient of thermal expansion (ppm/° C.) |
|---|---|---|---|
| Ceramics | Silicon nitride | $Si_3N_4$ | 3 |
|  | Silicon carbide | SiC | 4 |
|  | Aluminum nitride | AlN | 5 |
|  | Alumina | $Al_2O_3$ | 8 |
|  | Zirconia | $ZrO_2$ | 10 |

Figure 4:
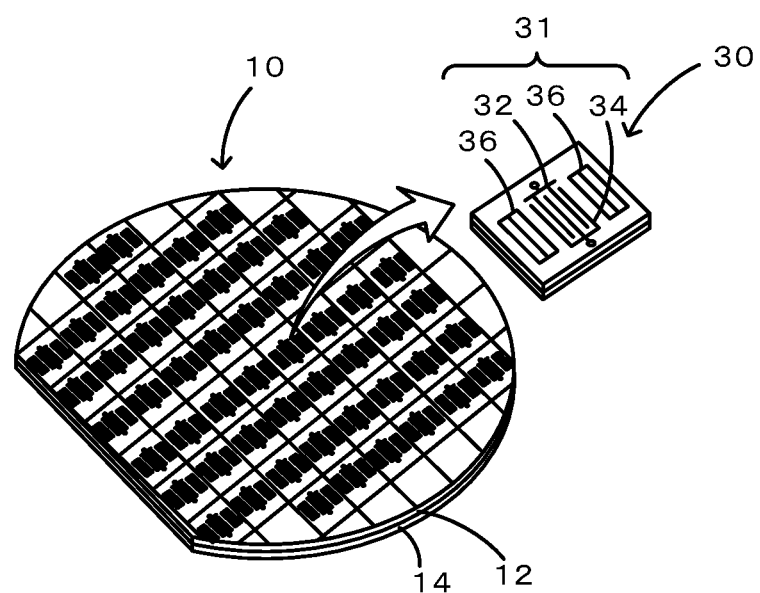
FIG. 4 is a view illustrating a process for manufacturing elastic wave devices 30.

Next, a method for forming an elastic wave device using the composite substrate 10 as described above will be described with reference to FIG. 4. FIG. 4 is a view illustrating a process for manufacturing elastic wave devices 30. First, elastic wave-device electrodes 31 are formed on a surface of the piezoelectric substrate 12 of the composite substrate 10. The surface of the piezoelectric substrate 12 is partitioned so that many elastic wave devices are to be formed, and the elastic wave-device electrodes 31 are formed at positions of respective elastic wave devices using a photolithographic technique. In addition, the electrodes 31 are each formed of IDT electrodes 32 and 34 and reflecting electrodes 36. Subsequently, dicing is performed along the partitions, so that many elastic wave devices 30 are obtained. When a high frequency signal is applied to the input-side IDT electrode 32 of the elastic wave device 30 thus obtained, an electric field is generated between the electrodes, and a surface acoustic wave is excited and propagated on the piezoelectric substrate 12. In addition, from the output-side IDT electrode 34 provided in a propagation direction, the surface acoustic wave thus propagated can be obtained as an electrical signal. That is, the elastic wave device 30 is a surface acoustic wave device.

According to the embodiment described above, the support substrate 14 formed of a so-called functionally gradient material can be used, and hence, a relatively simple structure is formed. In addition, as shown by the patterns L1 to L3 shown in FIG. 3, the coefficient of thermal expansion of the support substrate 14 is decreased along the thickness direction of the support substrate 14 from the second surface 14b to the intermediate position 14c. Hence, in the elastic wave device formed by using the composite substrate 10, the temperature coefficient of frequency is made equivalent or superior to that of an elastic wave device formed using a related support substrate. In addition, the warpage of the substrate generated when the composite substrate 10 is heated can also be reduced to be small.

Compared to the case of using the patterns L1 and L3, an effect of reducing the warpage becomes more significant in the case of using the pattern L2 (in which the coefficient of thermal expansion at the first surface 14a and the coefficient of thermal expansion at the second surface 14b are equal or approximately equal to that of the piezoelectric substrate 12, the coefficient of thermal expansion is decreased from the second surface 14b to the intermediate position 14c, and the coefficient of thermal expansion is increased from the intermediate position 14c to the first surface 14a). On the other hand, since an effect of improving the temperature coefficient of frequency (TCF) is high when the coefficient of thermal expansion is low at the first surface 14a, the effect described above is significant in the case of each of the patterns L1 and L3 as compared to that in the case of the pattern L2.

The present invention is not limited to the above-described embodiment. It is clear that the present invention can be implemented in a variety of embodiments without departing from the technical scope thereof.

For example, in the embodiment described above, although the patterns L1 to L3 showing the change in coefficient of thermal expansion along the thickness direction of the support substrate 14 are each illustrated as a smooth curve as shown in FIG. 3, the patterns L1 to L3 each may be a step function pattern. For example, the pattern L2 may be a pattern as shown by the solid line in FIG. 5.

Figure 5:
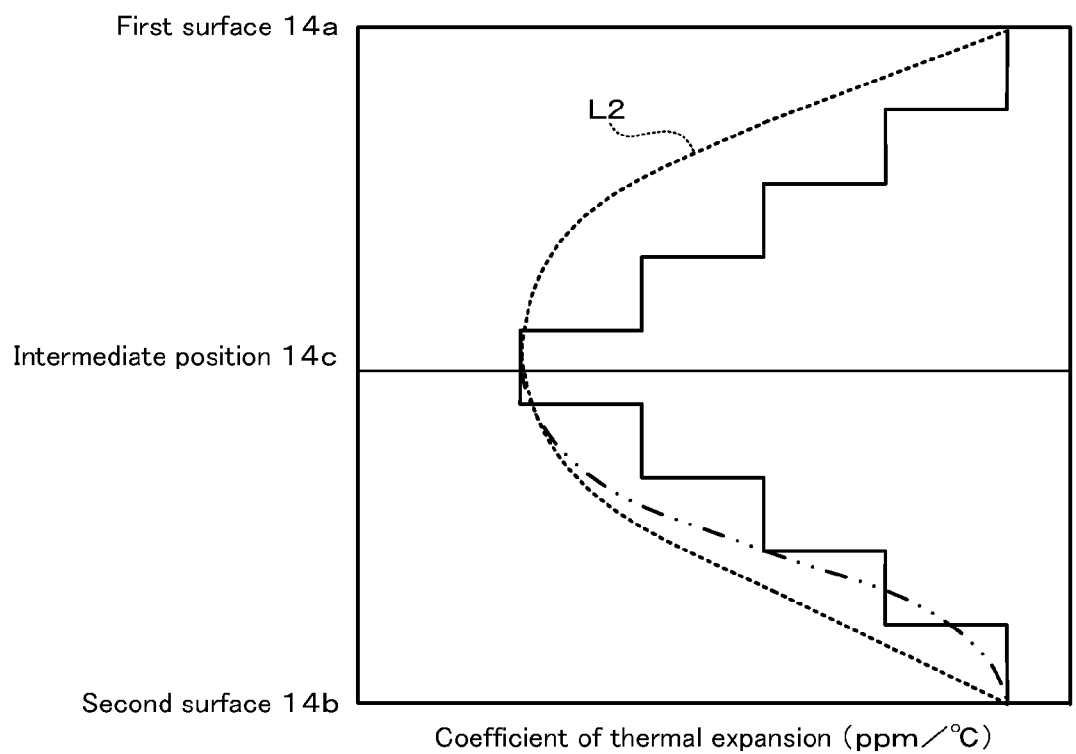
FIG. 5 is a graph showing the change in coefficient of thermal expansion along the thickness direction of the support substrate 14.

In addition, as long as the coefficient of thermal expansion along the thickness direction of the support substrate 14 is decreased from the second surface 14b to the intermediate position 14c, for example, the shape of the pattern L2 from the second surface 14b to the intermediate position 14c may have an S shape as shown by the two-dot chain line in FIG. 5. Furthermore, when the support substrate 14 is formed by firing a laminate including at least three molded bodies laminated to each other, as long as the coefficient of thermal expansion of one layer thereof is lower than that of the piezoelectric substrate 12, although the coefficient of thermal expansions of the other layers are preferably lower than that of the piezoelectric substrate 12, some of the other layers may have a higher coefficient of thermal expansion.

EXAMPLES

Example 1

Figure 6:
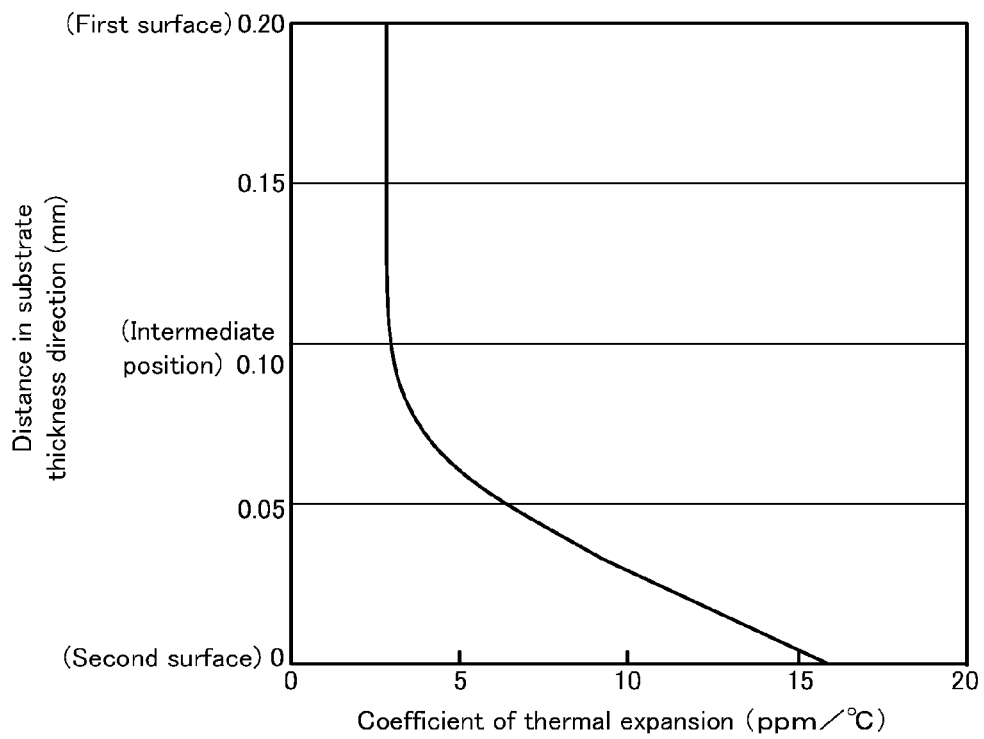
FIG. 6 is a graph showing the change in coefficient of thermal expansion along a thickness direction of a support substrate used in Example 1.

As a piezoelectric substrate, a $LiTaO_3$ substrate having a thickness of 180 μm and a diameter of 100 mm was prepared. In addition, as a support substrate, there was prepared a substrate having a thickness of 200 μm and a diameter of 100 mm and formed of a functionally gradient material in which the coefficient of thermal expansion in a substrate thickness direction was changed as shown in FIG. 6. This support substrate was formed so that the coefficients of thermal expansion at a first surface, an intermediate position, and a second surface were set to 3, 3, and 16 ppm/° C., respectively. The support substrate as described above was prepared as follows. First, three types of powdered materials, that is, silicon nitride, zirconia, and lithium tantalate, were prepared. Next, the weight ratio was adjusted so as to have a coefficient of thermal expansion shown in FIG. 6, and five thin green sheets were formed. Subsequently, those green sheets were laminated together and were then integrally fired.

Next, the piezoelectric substrate and the support substrate were placed in a vacuum chamber in which the degree of vacuum was maintained on the order of $10^{-6}$ Pa, and the rear surface of the piezoelectric substrate and the first surface of the support substrate were held so as to face each other. The rear surface of the piezoelectric substrate and the first surface of the support substrate were irradiated with Ar beams for 80 seconds to remove an inactive layer on each surface, so that the surfaces were activated. Next, the two substrates were brought into contact with and bonded to each other by applying a load of 1,200 kgf, so that a laminated substrate was formed. After this laminated substrate was recovered from the vacuum chamber, the piezoelectric substrate was ground by a grinding machine to have a thickness of 30 μm. Next, the laminated substrate thus ground was set in a lapping machine, and the piezoelectric substrate was polished using a diamond slurry to have a thickness of 21 μm. Furthermore, the surface of the piezoelectric substrate was polished by a CMP polishing machine to have a thickness of 20 μm, so that a work-affected layer was removed. In this step, as a polishing agent, colloidal silica was used. As described above, a composite substrate of Example 1 was obtained.

Comparative Example 1

As a support substrate, a silicon substrate having a coefficient of thermal expansion of 3 ppm/° C. (constant value) in a substrate thickness direction was prepared, and a composite substrate of Comparative Example 1 was formed by a method similar to that of Example 1.

[Evaluation]

The composite substrates of Example 1 and Comparative Example 1 were placed on a hot plate so that the second surface of each support substrate faced upward, and heating was performed to 250° C. As a result, the composite substrate of Comparative Example 1 was remarkably warped, and the end portion of the substrate rose from the upper surface of the hot plate by approximately 8 mm. On the other hand, the composite substrate of Example 1 was only slightly warped, and the end portion of the substrate rose from the upper surface of the hot plate only by approximately 2 mm. As described above, it could be confirmed that by the composite substrate of Example 1, the deformation of the substrate caused by heating could be significantly suppressed.

Next, a one-port SAW resonator was formed on the surface of the composite substrate of each of Example 1 and Comparative Example 1 at a piezoelectric substrate side, and the temperature coefficient of frequency (TCF) was measured. A measurement temperature range was set to −30° C. to 90° C. The TCF of the composite substrate of Comparative Example 1 was −20 ppm/° C. and was improved to approximately a half of that of a LiTaO$_3$ single plate. On the other hand, although the TCF of the composite substrate of Example 1 was −25 ppm/° C. and was slightly inferior to that of Comparative Example 1, a practically sufficient temperature compensation effect was obtained. As described above, it was confirmed that the composite substrate of Example 1 also had a high effect of improving the temperature characteristics.

Example 2

Figure 7:
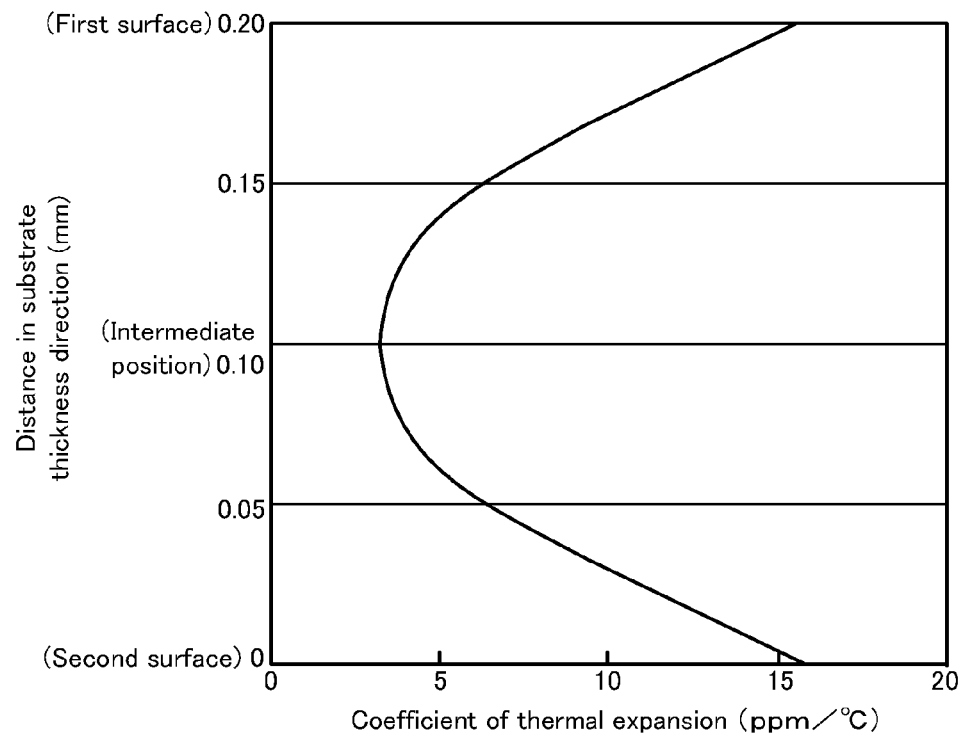
FIG. 7 is a graph showing the change in coefficient of thermal expansion along a thickness direction of a support substrate used in Example 2.

As a support substrate, there was prepared a substrate having a thickness of 200 μm and a diameter of 100 mm and formed of a functionally gradient material in which the coefficient of thermal expansion in a substrate thickness direction was changed as shown in FIG. 7. This support substrate was formed so that the coefficients of thermal expansion at a first surface, an intermediate position, and a second surface were set to 16, 3, and 16 ppm/° C., respectively. As a piezoelectric substrate, the same substrate as that of Example 1 was prepared. In addition, an adhesive was applied to respective bonding surfaces of the support substrate and the piezoelectric substrate to have a thickness of 0.3 μm. Subsequently, the two substrates were adhered to each other and then aged in an oven at 100° C. for 4 hours, so that the two substrates were pre-bonded to each other. Next, by a polishing method similar to that of Example 1, a composite substrate was formed. The composite substrate was again placed in an oven at 180° C. and then aged for 8 hours, so that a composite substrate of Example 2 was obtained.

[Evaluation]

The warpage and TCF of the composite substrate of Example 2 were evaluated in a manner similar to that of Example 1. As a result, the warpage of the composite substrate was further reduced, and the rise of the substrate end from the upper surface of the hot plate caused by heating to 250° C. was 1 mm or less. On the other hand, although the TCF was −27 ppm/° C., and the improvement effect was observed as compared to that of a LiTaO$_3$ single plate, the effect was slightly inferior to that of Example 1. In addition, according to calculation, a thermal stress generated at a bonding interface was approximately one fourth of that of Example 1. Hence, it is expected that the heat resistance be significantly improved. As described above, in the composite substrate of Example 2, although an appropriate effect of improving the TCF was obtained, the deformation of the substrate caused by heating was further significantly suppressed, and the thermal stress generated at the bonding interface could also be significantly reduced.

Example 3

Figure 8:
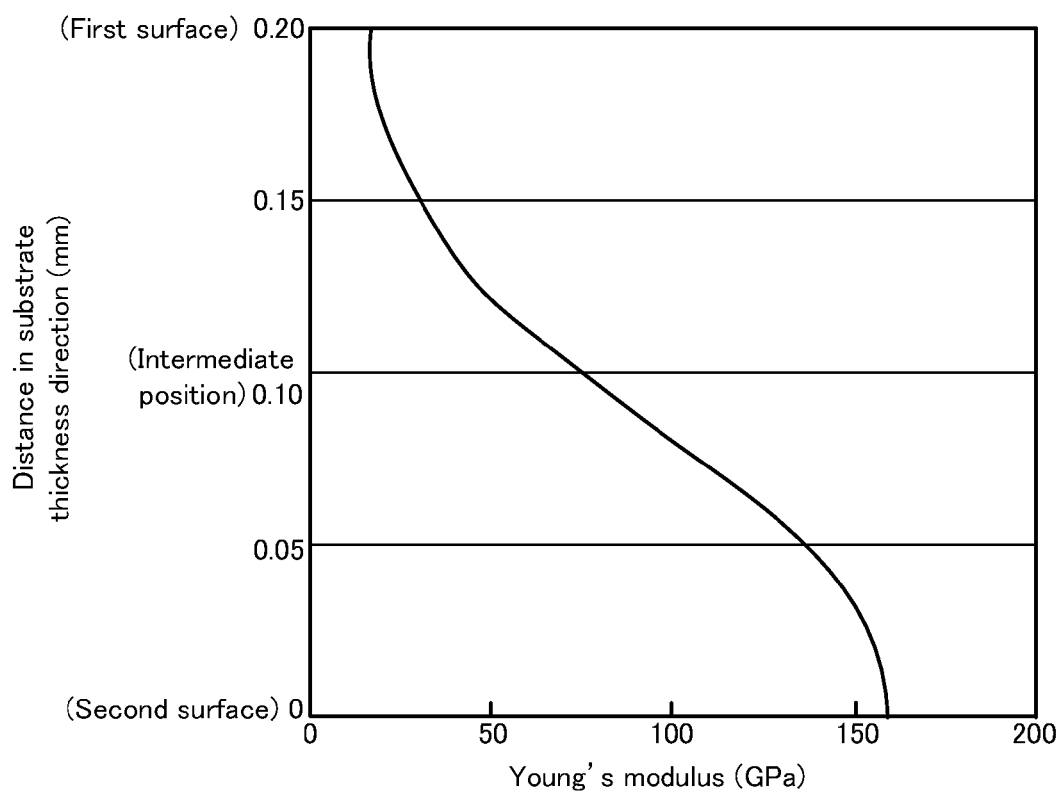
FIG. 8 is a graph showing the change in Young's modulus along a thickness direction of a support substrate used in Example 3.

As a support substrate, there was prepared a substrate having a thickness of 200 μm and a diameter of 100 mm and formed of a functionally gradient material in which the coefficient of thermal expansion in a substrate thickness direction was changed as shown in FIG. 8. This support substrate was formed so that the Young's moduli at a first surface and a second surface were set to 160 and 20 GPa, respectively, and hence, the Young's modulus was decreased from the second surface to the first surface. In addition, the coefficient of thermal expansion in a substrate thickness direction of this support substrate was set to 3 ppm/° C. (constant value). In addition, by using this support substrate, a composite substrate of Example 3 was formed by a method similar to that of Example 1.

Comparative Example 2

As a support substrate, a substrate was prepared which had a coefficient of thermal expansion of 3 ppm/° C. (constant value) and a Young's modulus of 160 GPa (constant value) in a substrate thickness direction, and a composite substrate of Comparative Example 2 was formed by a method similar to that of Example 1.

[Evaluation]

When the thermal stress generated at the bonding interface of the composite substrate of each of Example 3 and Comparative Example 2 was calculated, the thermal stress of Example 3 was dramatically decreased to one third or less of that of Comparative Example 2. On the other hand, the warpage of the composite substrate of Example 3 was large, and the rise of the substrate end from the front surface of the hot plate caused by heating to 250° C. was 10 mm. In addition, the TCF of Example 3 was −29 ppm/° C. and was approximately the same as that of Comparative Example 3. As described above, although the effect of improving the warpage and TCF was not so much significant in the composite substrate of Example 3, the thermal stress generated at the bonding interface was dramatically reduced.

The present application claims priority from Japanese Patent Application No. 2013-66319 filed on Mar. 27, 2013, the entire contents of which are incorporated herein by reference.

INDUSTRIAL APPLICABILITY

The present invention may be applied to an elastic wave device, such as a SAW filter.

What is claimed is:

1. A composite substrate formed by bonding a piezoelectric substrate and a support substrate having a coefficient of thermal expansion lower than that of the piezoelectric substrate,
wherein the support substrate has a first surface bonded to the piezoelectric substrate and a second surface opposite to the first surface, and one specific characteristic value selected from the coefficient of thermal expansion and the Young's modulus is decreased along a thickness direction from the second surface to an intermediate position between the first surface and the second surface.

2. The composite substrate according to claim 1, wherein the specific characteristic value is increased along a thickness direction from the intermediate position to the first surface.

3. The composite substrate according to claim 2, wherein the specific characteristic value is the coefficient of thermal expansion, and the coefficients of thermal expansion at the first surface and the second surface are each substantially the same as that of the piezoelectric substrate.

4. The composite substrate according to claim 1, wherein the specific characteristic value is approximately constant along a thickness direction from the intermediate position to the first surface.

5. The composite substrate according to claim 1, wherein the specific characteristic value is decreased along a thickness direction from the intermediate position to the first surface.

6. The composite substrate according to claim 1, wherein the support substrate is formed by firing a laminate including at least three layers having different compositions.

7. An elastic wave device comprising:

the composite substrate according to claim 1, and an elastic wave-device electrode formed on a surface of the piezoelectric substrate of the composite substrate.

* * * * *